United States Patent
Hsu et al.

(10) Patent No.: US 7,811,845 B2
(45) Date of Patent: Oct. 12, 2010

(54) METHOD FOR MANUFACTURING HIGH EFFICIENCY LIGHT-EMITTING DIODES

(75) Inventors: Ta-Cheng Hsu, Hsinchu (TW);
Jung-Min Hwang, Hsinchu (TW);
Min-Hsun Hsieh, Hsinchu (TW);
Ya-Lan Yang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 251 days.

(21) Appl. No.: 11/602,199

(22) Filed: Nov. 21, 2006

(65) Prior Publication Data

US 2007/0128750 A1 Jun. 7, 2007

(30) Foreign Application Priority Data

Nov. 21, 2005 (TW) .............................. 94140757 A

(51) Int. Cl.
*H01L 21/00* (2006.01)

(52) U.S. Cl. ......................................... 438/33; 438/22
(58) Field of Classification Search ............. 438/22–47, 438/21, 20
See application file for complete search history.

(56) References Cited

U.S. PATENT DOCUMENTS

| | | | | |
|---|---|---|---|---|
| 5,912,477 | A * | 6/1999 | Negley | 257/95 |
| 6,239,033 | B1 * | 5/2001 | Kawai | 438/693 |
| 6,298,079 | B1 * | 10/2001 | Tanaka et al. | 372/46.01 |
| 6,468,902 | B2 * | 10/2002 | Kawai | 438/667 |
| 6,605,548 | B1 * | 8/2003 | Bardwell | 438/745 |
| 6,849,524 | B2 * | 2/2005 | Shelton et al. | 438/465 |
| 2005/0221515 | A1 * | 10/2005 | Yanashima et al. | 438/21 |
| 2008/0070380 | A1 * | 3/2008 | Kusunoki | 438/462 |

* cited by examiner

*Primary Examiner*—Douglas M Menz
(74) *Attorney, Agent, or Firm*—Bacon & Thomas, PLLC

(57) ABSTRACT

A method for manufacturing a light-emitting device comprising the steps of cutting a light-emitting unit by a laser beam, and cleaning the light-emitting unit by an acid solution to remove by-products resulted from the laser cutting.

16 Claims, 6 Drawing Sheets

US 7,811,845 B2

METHOD FOR MANUFACTURING HIGH EFFICIENCY LIGHT-EMITTING DIODES

BACKGROUND OF THE INVENTION

1. Technical Field

The present invention relates to methods for manufacturing light-emitting diodes and in particular to a method for producing high efficiency light-emitting diodes.

2. Reference to Related Application

This application claims the right of priority based on TW application Ser. No. 94140757, filed Nov. 21, 2005, entitled Method for manufacturing high efficiency light-emitting diodes, and the contents of which are incorporated herein by reference.

3. Description of the Related Art

Nitride semiconductor light emitting devices have been employed in a wide variety of applications, including traffic lights, backlights of electronic apparatus, outdoor optical displays, white light illumination apparatus, UV light apparatus, and data storage apparatus.

In a nitride semiconductor light-emitting device, a structure of the nitride semiconductor light-emitting device includes a substrate, which can be made of sapphire or SiC (silicon carbide). In a process of the nitride semiconductor light-emitting device manufacture, the process includes forming a epitaxial light emitting stack on a substrate wafer, and then cutting the epitaxial wafer into dice. The epitaxial wafer can be separated into dice by a number of ways, for example, the epitaxial wafer can be mechanically scribed, such as with a diamond, and then be separated along scribe lines. However the hardness of the sapphire and the SiC is greater than traditional III-V materials (for example Si or GaAs), and it is difficult and time-consuming to cut the epitaxial wafer having the sapphire or SiC substrate. Furthermore, the consumption of the diamond is so great that the manufacturing cost is raised.

Another separation method involves scribing the wafer by a high energy density laser beam ablating the bonds between atoms of the substrate. In laser ablation scribing, the scribing temperature has to be high enough to break the crystal bonds of the substrate and then results in the build-up of waste material along the scribe lines. Because the light emitting from the light-emitting device can be absorbed by the waste material, the light extraction efficiency is reduced.

In U.S. Pat. No. 5,631,190, a dry etching method of removing by-products generated from cutting the silicon carbide substrate by the laser light is disclosed. The dry etching method can damage the device and affect the product characteristics. Besides, the dry etching method causes the wafer breakage and reduces the product yield.

In U.S. Pat. No. 6,849,524, a wet etching method of using a KOH cleaning solution to remove by-products generated from cutting the sapphire substrate by the laser light is disclosed. The cleaning solution can remove slag from the cutting and debris from the breaking. This method applies a protective coating on the cutting side of the sapphire wafer, and then cleans the sapphire wafer with the cleaning solution. However, the method cannot remove the slag completely and efficiently.

Therefore, how to remove the by-products resulting from the laserbeam cutting efficiently to enhance the light extraction of LEDs becomes an important issue in the technology.

SUMMARY OF THE INVENTION

Accordingly, the present invention is to provide a method of forming a light-emitting device having higher light-emitting efficiency. As embodied and broadly described herein, the present invention provides a method of high efficiency light-emitting device comprising the steps of cutting a light-emitting wafer by a laser beam, cleaning the light-emitting wafer by an acid solution to remove by-products resulted from the laser beam cutting. The light-emitting wafer includes a wafer substrate, and a light-emitting stack is disposed on the wafer substrate. The light-emitting device is formed after the steps of cutting the light-emitting wafer by the laser beam and cleaning the light-emitting wafer by the acid solution.

In summary, the method of cleaning the by-products resulted from the laser beam cutting on the light-emitting wafer by the acid solution can avoid the light absorption by the by-products, and the brightness of the light-emitting device can be enhanced greatly. Furthermore, the acid solution can remove the by-products efficiently, and the cleaning time can be reduced. Moreover, The problem of wafer breakage in the conventional process can be solved, and the product yield can be enhanced.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1A:
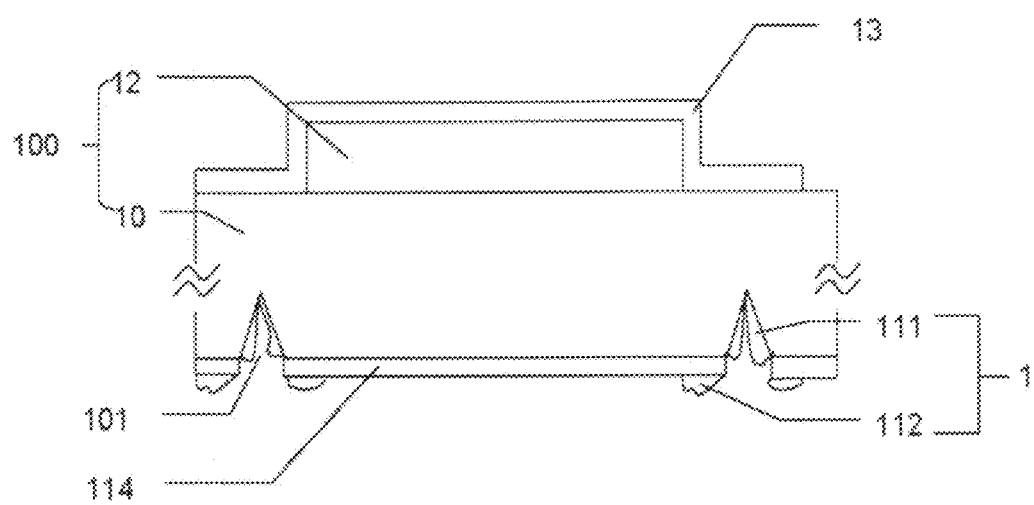
FIG. 1A is a schematic cross-sectional view of a light-emitting device with by-products deposited according to a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Figure 1B:
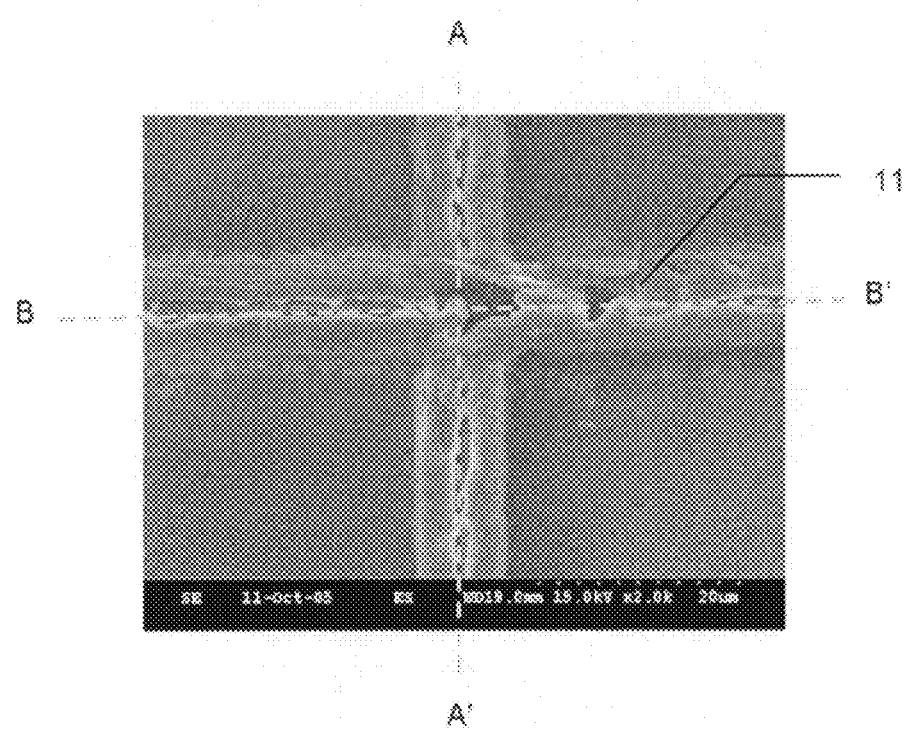
FIG. 1B is a top-view photograph of the light-emitting device with the by-products deposited taken by an SEM.
Figure 1C:
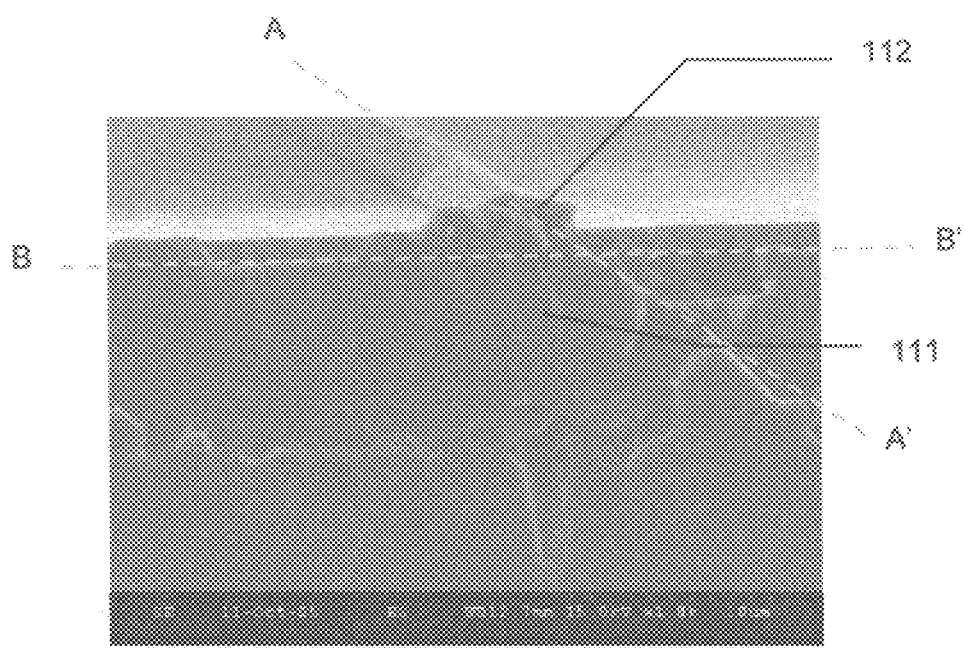
FIG. 1C is a cross-sectional photograph of the light-emitting device with the deposit of by-products taken by an SEM.

Referring to FIGS. 1A-1C, the schematic cross-sectional views showing a light-emitting device with by-products deposited according to a first embodiment of the present invention respectively. The processes of manufacturing the light-emitting device mainly comprises disposing a light-emitting stack 12 over an upper surface of a substrate 10 to form a light-emitting unit 100, coating a first protective layer 13 on an upper surface of the light-emitting stack 12, cutting a lower surface of the substrate 10 by a laser beam, and putting the light-emitting unit 100 with the first protective layer 13 into a warm acid solution for a predetermined period of time. The substrate is cut by the laser beam of a wavelength less than 365 nm from the lower surface of the substrate 10 to generate cutting lines 101. By-products 11 comprise first by-products 111 and second by-products 112. By-products 111 are deposited in the cutting lines 101 and by-products 112 are deposited around the cutting lines 101 of the lower surface of the substrate 10.

FIG. 1B is a top-view photograph of the light-emitting device with by-products taken by an SEM (scanning electron microscope). One of the cutting lines 101 has an extension direction A-A' and the other has an extension direction B-B'. There are a lot of by-products 11 deposited around the cutting lines 101. FIG. 1C is a cross-sectional photograph of the light-emitting device with by-products taken by an SEM. There are a lot of by-products 11 deposited around the cutting line along with direction A-A' and in the cutting line along with direction B-B'.

The compositions of the acid solution are phosphoric acid ($H_3PO_4$) and sulfuric acid ($H_2SO_4$). The preferred cleaning temperature of the acid solution is higher than the atmospheric temperature. Furthermore, a second protective layer 114 can be deposited on the lower surface of the substrate 10 in order to avoid any damage caused by the acid solution.

Figure 2A:
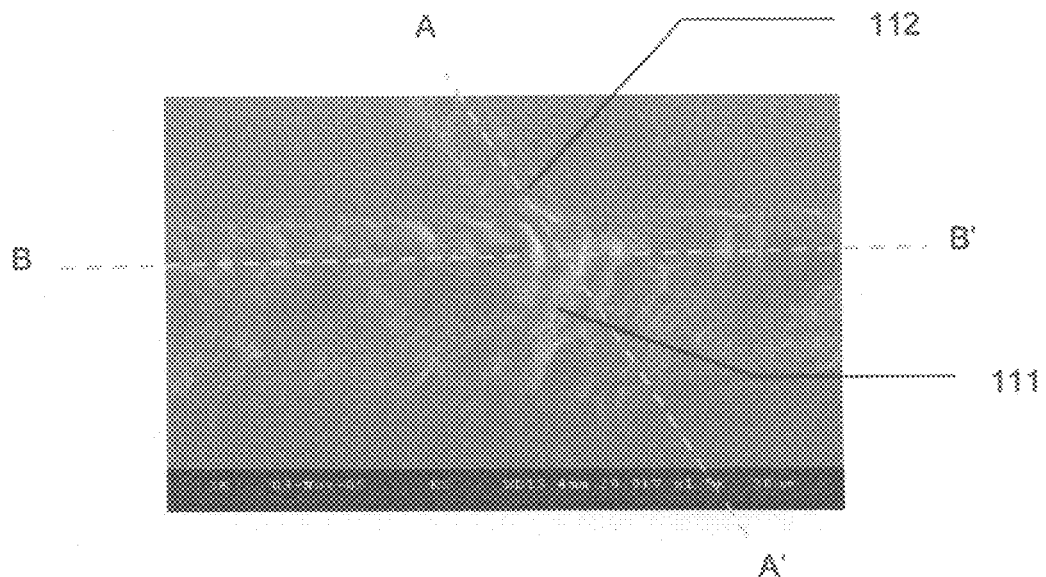
FIGS. 2A, 2B, and 2C are photographs of the light-emitting device with the by-products deposited after cleaning for different cleaning time respectively taken by an SEM.
Figure 2B:
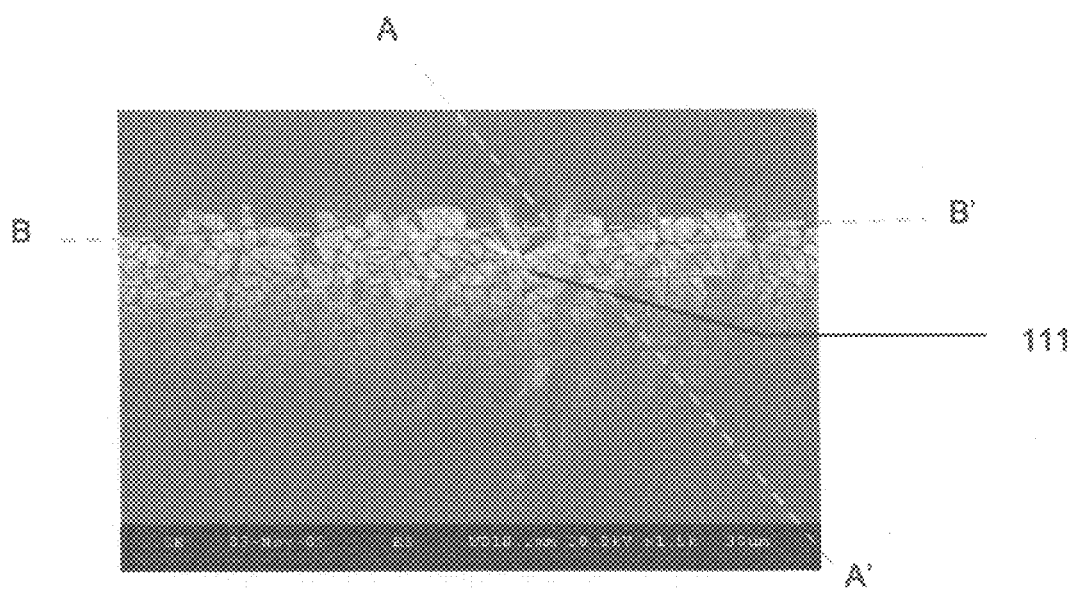
Figure 2C:
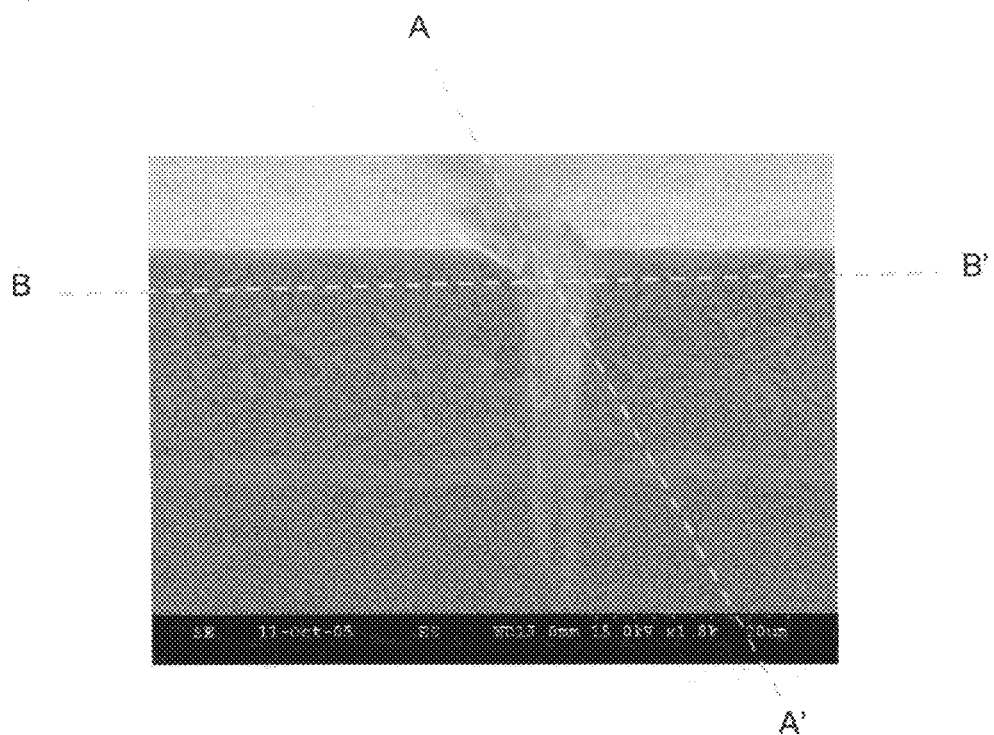

FIGS. 2A to 2C are SEM pictures showing the results of several experiments with different cleaning temperature and cleaning time. Referring to FIG. 2A, the cutting lines are cleaned by an acid solution in an experiment I. The ratio of the $H_3PO_4$ to the $H_2SO_4$ adopted in experiment I is 2:1, and the temperature of the acid solution is 130° C. The light-emitting device 1 is cleaned in the acid solution for 10 minutes, but the by-products 111 and 112 cannot be removed. Referring to FIG. 2B, the cutting lines are cleaned by an acid solution in an experiment II. The light-emitting device 1 is cleaned in the acid solution having the temperature of 240° C. for 2 minutes. The by-products 112 deposited around the cutting line of the lower surface of the substrate 10 are removed, but the by-products 111 deposited in the cutting line still cannot be removed. Referring to FIG. 2C, the cutting lines are cleaned by an acid solution in an experiment III. The light-emitting device 1 is cleaned in the acid solution of the temperature of 330° C. for 1 minutes, and the by-products 111 and 112 are totally removed.

Figure 3:
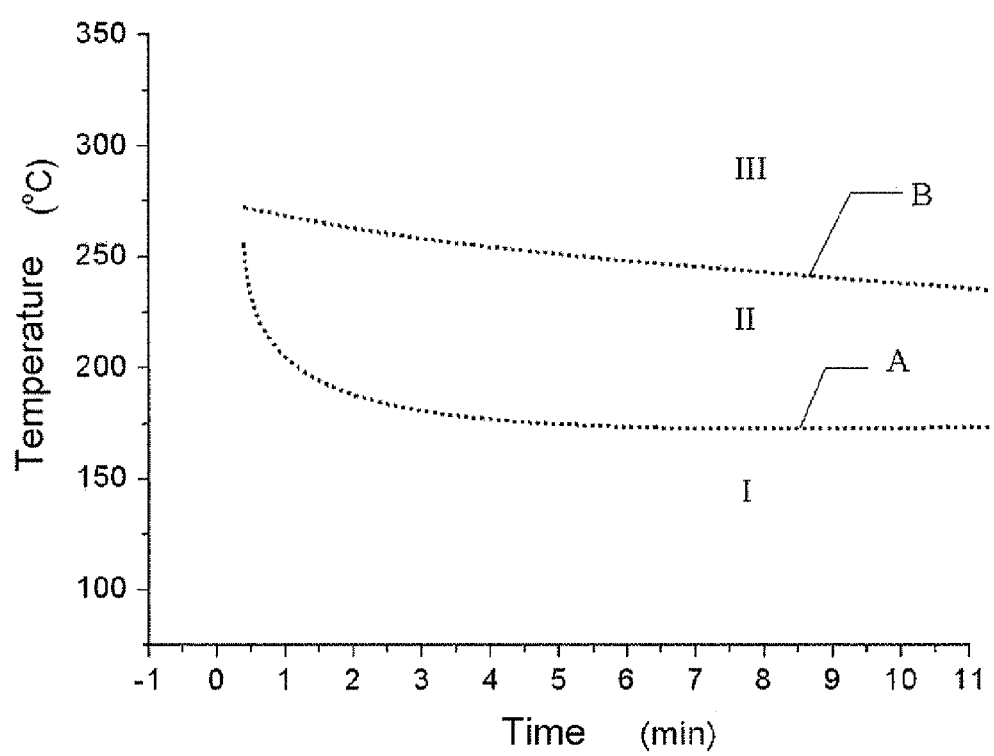
FIG. 3 is a diagram showing a relationship between by-products cleaning efficiency, cleaning temperature, and cleaning time.

The foregoing are just some experiments of the first embodiment. After many experiments, the results are plotted in FIG. 3. The curve A is a limit of the cleaning condition to remove the second by-products 112, and the curve B is a limit of the cleaning condition to remove the first by-products 111 and the second by-products 112. If a cleaning procedure is performed with the condition of region I, the by-products cannot be removed. When a cleaning procedure is performed with the condition of region II for which the temperature of the acid solution is between 200° C. to 250° C., the second by-products 112 can be removed. When a cleaning procedure is performed with the condition of region III for which the temperature of the acid solution is equal or greater than 250° C., the first by-products 111 and the second by-products 112 can be removed.

The composition ratio of the acid solution can be changed based on the user requirement. If the user prefers a shorter cleaning time, an acid solution with a higher ratio of the $H_2SO_4$ and higher cleaning temperature can serve the purpose. The acid solution has a good selectivity between the by-products 11 and the substrate 10, and most of the by-products 11 can be removed without damaging the substrate.

Figure 4:
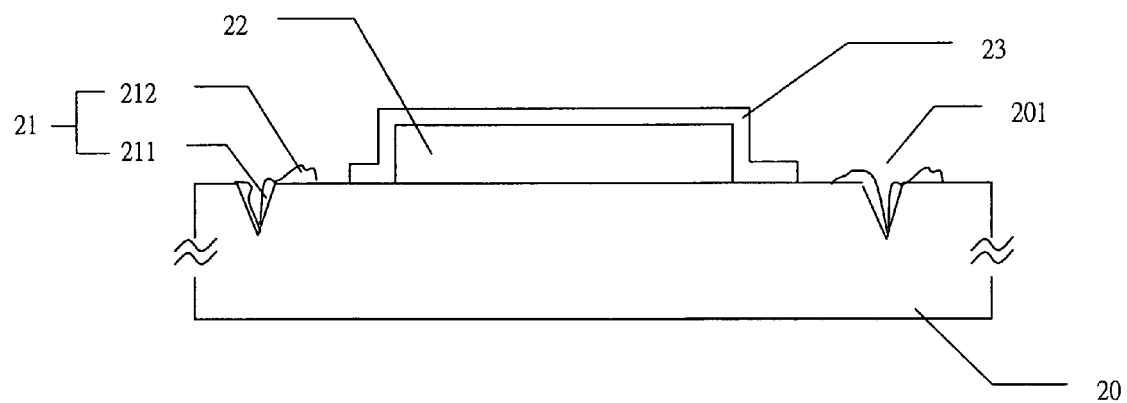
FIG. 4 is a schematic cross-sectional view of a light-emitting device with by-products deposited according to a second embodiment of the present invention.

Referring to FIG. 4, a schematic cross-sectional view of a light-emitting device with by-products deposited in accordance with a second embodiment of the present invention is shown. The method of manufacturing the light-emitting device mainly comprises disposing a light-emitting stack 22 over an upper surface of a substrate 20 to form a light-emitting unit 200, coating a protective layer 23 of a preferred thickness of 1-4 μm on an upper surface of the light-emitting stack 22, cutting the light-emitting stack 22 from the upper surface by a laser beam with a wavelength less than 365 nm, and putting the light-emitting unit 200 with the first protective layer 23 into an acid solution for a predetermined period of time to remove the by-products resulted from the laser cutting. When the substrate is cut by the laser beam from the upper surface of the substrate 20, cutting lines 201 are formed. By-products 21 comprise a third by-products 211 and a forth by-products 212. The first by-products 211 are deposited in the cutting lines 201 and the forth by-products 212 are deposited around the cutting lines 201.

The composition of the acid solution includes $H_3PO_4$ and $H_2SO_4$. The preferred temperature of the acid solution is higher than the atmospheric temperature. In the second embodiment, the temperature of the acid solution is 320° C. The light-emitting device 2 is cleaned in the acid solution for 10-60 seconds. A second protective layer can be deposited on the lower surface of the substrate 20 in order to avoid any damage caused by the acid solution. The depth of the cutting lines 201 can reach to the lower surface of the substrate 20.

In one embodiment of the present invention, the method thereof further comprises a breaking process to separate the light-emitting device into chips after putting the light-emitting unit into the acid solution.

The material of the substrate comprises at least one material selected from the group consisting of sapphire, SiC, GaN, AlN, ZnO, MgO, and any combination thereof. The light-emitting stack comprises a first conductive type semiconductor, a light-emitting layer, and a second conductive type semiconductor. The material of the first conductive type semiconductor comprises at least one material selected from the group consisting of AlGaInP, AlInP, GaInP, AlN, GaN, AlGaN, InGaN, and AlInGaN. The material of the light-emitting layer comprises at least one material selected from the group consisting of AlGaInP, AlInP, GaInP, GaN, InGaN, and AlInGaN. The material of the second conductive type semiconductor comprises at least one material selected from the group consisting of AlGaInP, AlInP, GaInP, AlN, GaN, AlGaN, InGaN, and AlInGaN. The material of the first protective layer, second protective layer, or protective layer comprises at least one material selected from the group consisting of gold, platinum, titanium, $Si_3N_4$, epoxy, and photoresist.

It is intended that the present invention covers modifications and variations of this invention provided they fall within the scope of the following claims and their equivalents.

What is claimed is:

1. A method for manufacturing a light-emitting device comprising the steps of:

cutting a light-emitting unit by a laser beam, whereby said cutting generates by-products on the light-emitting unit; and cleaning the light-emitting unit and removing the by-products from the light emitting unit by an acid solution comprising phosphoric acid ($H_3PO_4$) and sulfuric acid ($H_2SO_4$), at a temperature not lower than 200° C.;

wherein the light-emitting unit comprises a substrate and a light-emitting stack disposed on an upper surface of the substrate; and wherein the by-products comprise by-products of the substrate formed directly on the substrate or the light-emitting stack.

2. The method for manufacturing a light-emitting device according to claim 1, wherein the light-emitting stack further comprises:
a first semiconductor layer;
a semiconductor light-emitting layer disposed over the first semiconductor layer; and
a second semiconductor layer disposed over the semiconductor light-emitting layer.

3. The method for manufacturing a light-emitting device according to claim 2, further comprising a first protective layer disposed over an upper surface of the light-emitting stack.

4. The method for manufacturing a light-emitting device according to claim 2, wherein a lower surface of the substrate is cut by the laser beam, and at least one first cutting line is formed.

5. The method for manufacturing a light-emitting device according to claim 2, wherein a second protective layer is disposed over a lower surface of the substrate.

6. The method for manufacturing a light-emitting device according to claim 2, wherein the upper surface of the substrate is cut by the laser beam, and at least one second cutting line is formed.

7. The method for manufacturing a light-emitting device according to claim 6, wherein the depth of the second cutting line approaches the lower surface of the substrate.

8. The method for manufacturing a light-emitting device according to claim 1, wherein the preferred temperature is 250° C.

9. The method for manufacturing a light-emitting device according to claim 1, further comprising a separating process.

10. The method for manufacturing a light-emitting device according to claim 3, wherein the first protective layer comprises at least one material selected from the group consisting of gold, platinum, titanium, $Si_3N_4$, epoxy, and photoresist.

11. The method for manufacturing a light-emitting device according to claim 5, wherein the second protective layer comprises at least one material selected from the group consisting of gold, platinum, titanium, $Si_3N_4$, epoxy, and photoresist.

12. The method for manufacturing a light-emitting device according to claim 1, wherein the substrate comprises at least one material selected from the group consisting of SiC, GaN, AlN, ZnO, MgO, and any combination thereof.

13. The method for manufacturing a light-emitting device according to claim 12, wherein the temperature is 250° C.

14. The method for manufacturing a light-emitting device according to claim 1, wherein the light-emitting device is cleaned in the acid solution at a temperature of 330° C. for 1 minute.

15. A method for manufacturing a light-emitting device comprising the steps of:
cleaning a light-emitting unit cut by a laser beam and removing by-products generated by the cutting from the light emitting unit by an acid solution comprising phosphoric acid ($H_3PO_4$) and sulfuric acid ($H_2SO_4$), at a temperature equal to or greater than 250° C.;
wherein the light-emitting unit comprises a substrate and a light-emitting stack disposed on an upper surface of the substrate; and
wherein the by-products comprise by-products of the substrate formed directly on the substrate or the light-emitting stack.

16. The method for manufacturing a light-emitting device according to claim 15, wherein the light-emitting unit comprises a cutting line formed by the laser beam, and the by-products deposit in and around the cutting line.

* * * * *